United States Patent [19]

George et al.

[11] Patent Number: 4,812,101

[45] Date of Patent: Mar. 14, 1989

[54] METHOD AND APPARATUS FOR CONTINUOUS THROUGHPUT IN A VACUUM ENVIRONMENT

[75] Inventors: Carroll H. George, Norwood, N.Y.; Guy W. Lynott, Succasunna; Andrew N. Pargellis, Hoboken, both of N.J.

[73] Assignee: American Telephone and Telegraph Company, AT&T Bell Laboratories, Murray Hill, N.J.

[21] Appl. No.: 42,507

[22] Filed: Apr. 27, 1987

[51] Int. Cl.⁴ ............................................. B65G 65/00
[52] U.S. Cl. .................................. 414/220; 414/217; 414/786; 384/10; 384/15; 277/DIG. 7; 204/298
[58] Field of Search ............ 384/10, 15; 277/DIG. 7; 414/217, 220, 221, 786; 204/298

[56] References Cited

U.S. PATENT DOCUMENTS

| | | | |
|---|---|---|---|
| 3,692,272 | 9/1972 | Radke | 384/15 |
| 4,249,846 | 2/1981 | Worsham | 414/217 |
| 4,266,111 | 5/1981 | Trillwood | 414/217 |
| 4,398,728 | 8/1983 | Sukegawa et al. | 277/DIG. 7 |
| 4,501,428 | 2/1985 | Ueno et al. | 277/DIG. 7 |

Primary Examiner—John F. Niebling
Assistant Examiner—Steven P. Marquis
Attorney, Agent, or Firm—Lester H. Birnbaum

[57] ABSTRACT

Disclosed is a method and apparatus for continuous introduction and exit of workpieces into and out of a vacuum. A first seal is provided between the atmosphere and a first pumping station. This seal comprises compliant members positioned within cavities in a plate so that the pressure differential causes the members to push against the workpiece and the cavity wall to establish a rotating seal. A second seal may also be provided between the first pumping station and the vacuum chabmer. This seal includes compliant members mounted within a series of differentially pumped cavities and providing a low friction seal with the workpiece.

11 Claims, 4 Drawing Sheets

FIG. 5
FIG. 6
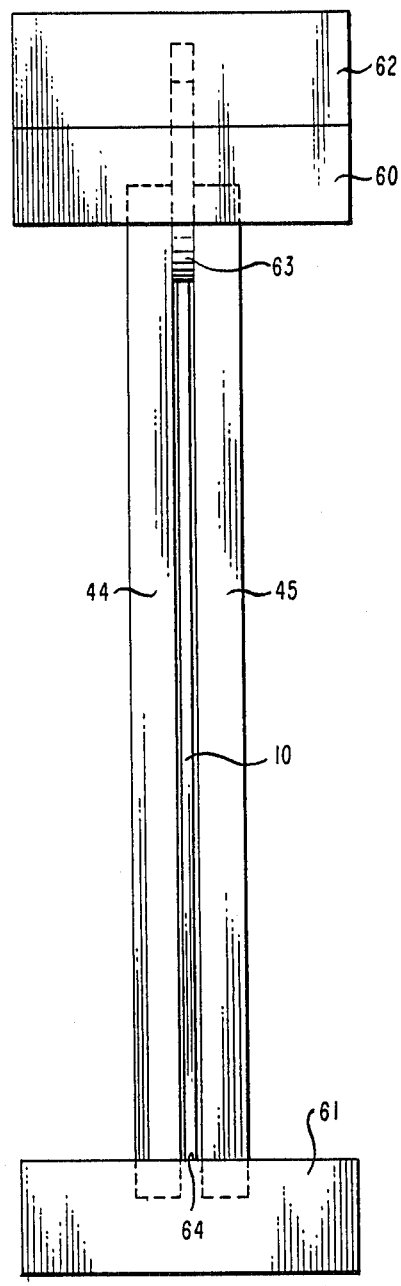
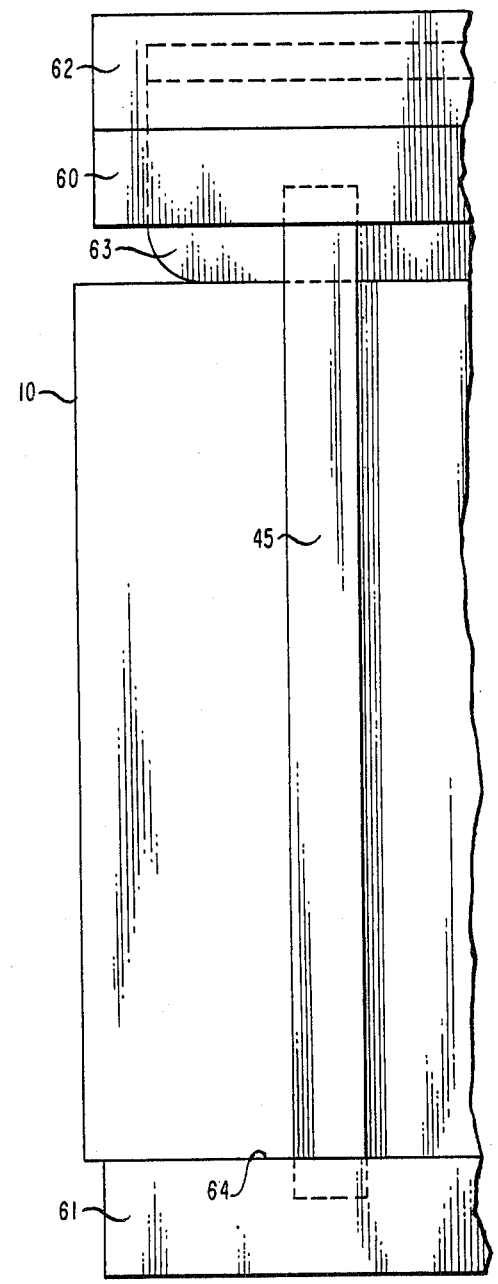

METHOD AND APPARATUS FOR CONTINUOUS THROUGHPUT IN A VACUUM ENVIRONMENT

BACKGROUND OF THE INVENTION

This invention relates to handling of workpieces so that a continuous throughput is achieved for processing in a vacuum environment.

A great variety of manufacturing processes require a vacuum environment. For example, sputtering, plasma etching, evaporation and chemical vapor deposition are common processes in the fabrication of semiconductor devices and all require a vacuum. In order to be cost effective, such processes could include some means for continuous throughput of the workpieces into and out of the vacuum chamber. This usually requires advancing the workpieces through a series of pumping stations of succesively reduced pressure until the workpieces enter the vacuum chamber and then successively increasing pressure from the vacuum chamber to the environment.

Continuous throughput, therefore, usually requires some type of sealing mechanism which prevents leaks between pumping stations as the workpieces move through. Providing such a mechanism involves considerable difficulty, however, since the seal must typically be able to withstand, without substantial leaks, a large pressure drop if employed adjacent to the entrance from or exit to the atmosphere. The mechanism must also provide as little friction as possible so as not to impede the movement of the workpieces. This is a particular problem where the workpieces are large, such as the panels from which printed circuit boards are formed, which typically measure 61.0 cm × 45.7 cm × 1.57 mm.

SUMMARY OF THE INVENTION

In accordance with one aspect, the invention is a method of moving a workpiece between the atmosphere and a vacuum chamber. The workpiece is passed between a pair of compliant members mounted in cavities defined by an enclosure located between the atmosphere and the vacuum chamber. These members form a rotating seal with their respective cavity walls and the workpiece as it passes therethrough.

In accordance with another aspect, the invention is an apparatus for processing of workpieces in a vacuum chamber including means for continuous feeding of the workpieces between the atmosphere and the vacuum chamber. The apparatus comprises a sealing unit located between the atmosphere and the vacuum chamber. The unit comprises a pair of compliant members located in cavities defined by enclosures which form a gap to permit passage of the workpieces therethrough. The cavities are coupled to the atmosphere so that the compliant members are pushed against a wall of their respective cavities and against a major surface of the workpiece to form a rotating seal therewith when the workpieces are fed therethrough.

BRIEF DESCRIPTION OF THE DRAWINGS

These and other features of the invention are delineated in detail in the following description. In the drawing:

FIG. 5 is another view of the more detailed version of the portion of the apparatus of FIG. 3;

FIG. 6 is another view of the portion shown in FIG. 5;

It will be appreciated that for purposes of illustration, these figures are not necessarily drawn to scale.

DETAILED DESCRIPTION

Figure 1:
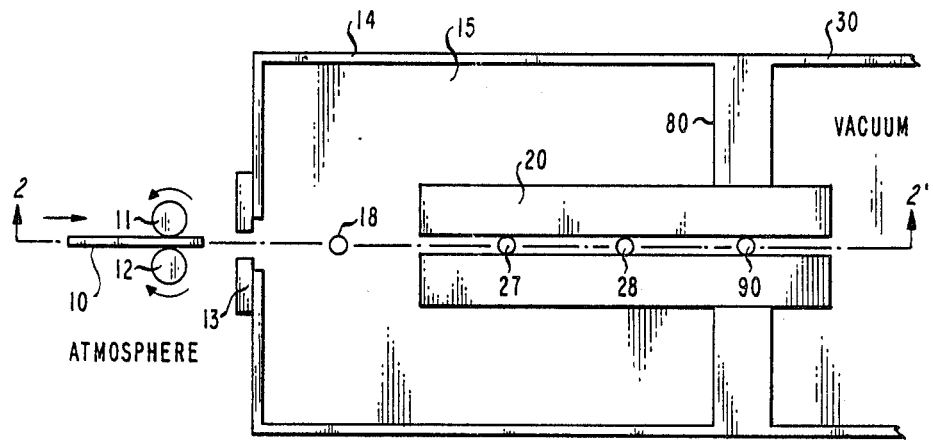
FIG. 1 is a schematic plan view of apparatus in accordance with one embodiment of the invention.
Figure 2:
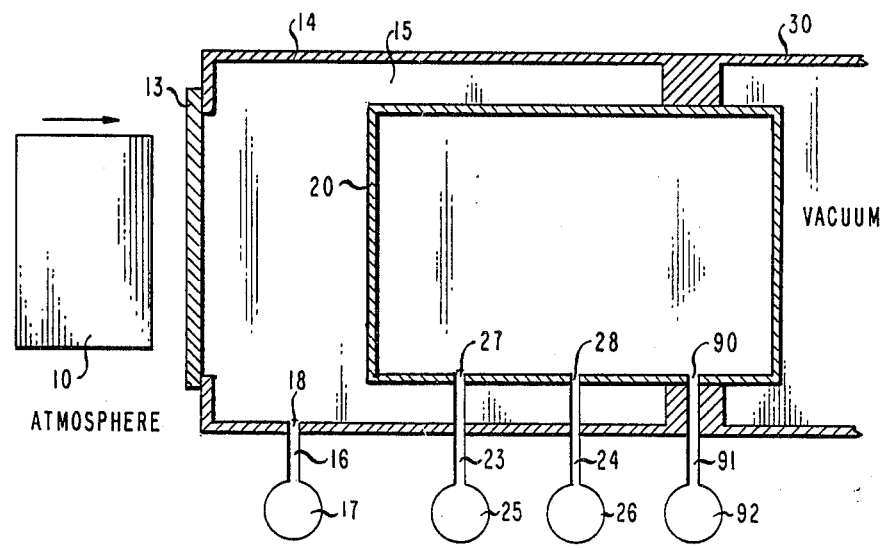
FIG. 2 is a cross-sectional view along line 2-2' of FIG. 1.

A schematic plan view of the apparatus according to one embodiment of the invention is shown in FIG. 1, and a cross-sectional view of that apparatus is given in FIG. 2. The particular apparatus discussed is utilized for sputtering a coating onto a printed circuit board panel, 10, but it should be appreciated that the apparatus may be utilized for any type of operation requiring a vacuum chamber.

Figure 7:
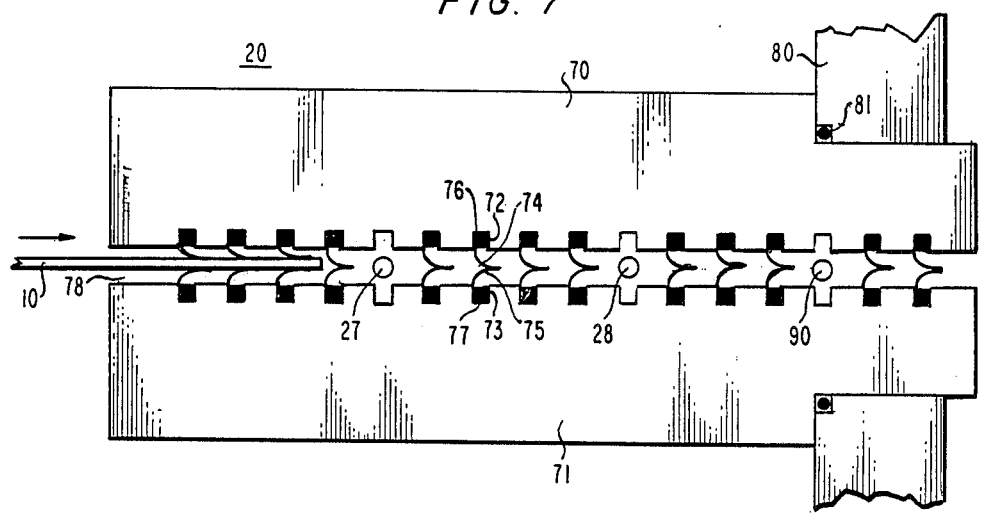
FIG. 7 is a more detailed version of another portion of the apparatus of FIG. 1.
Figure 8:
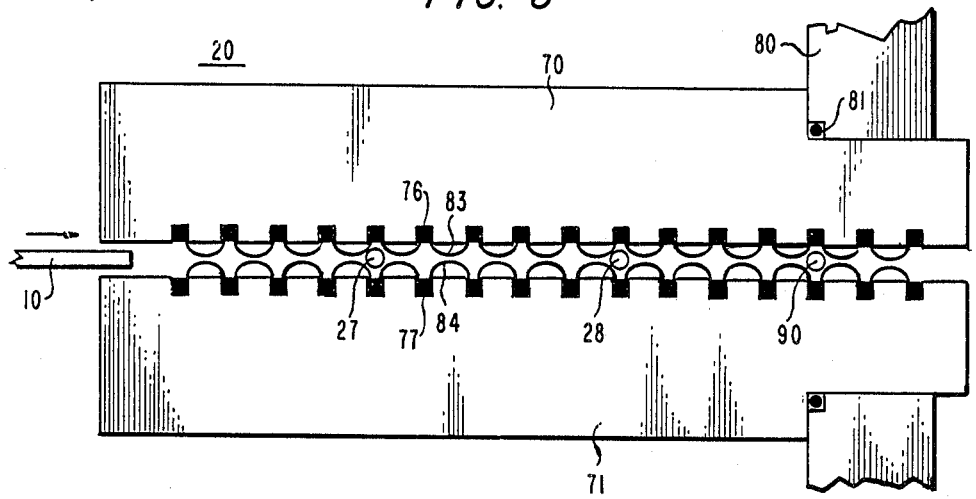
FIG. 8 is further embodiment of the portion of the apparatus of FIG. 7.

The panel, 10, is driven by a pair of rollers, 11 and 12, on either side of the major surfaces of the panel. (The view of FIG. 1 is looking down from the top of the apparatus.) The rollers rotate as shown by the arrows to move the panel to the right. The rollers drive the panel through a first sealing unit, 13, disposed between the atmosphere and an air lock chamber 14. Alternatively, the sealing unit, 13, could be located within the air lock chamber 14. The sealing unit will be described and shown in more detail below. The air lock chamber, 14, includes a first portion, 15, which is pumped down to some desired pressure by the combination of hose 16 and pump 17 connected to said portion by means of an opening, 18, in the chamber floor. A typical pressure for the portion, 15, would be in the range $10^3$–$10^4$ Pascals. Also located in the air lock chamber, 14, in the path of the panel, 10, is a second sealing unit, 20, which will also be shown and described in more detail below. Portions of this sealing unit are also pumped down to a desired pressure by hoses, 23 and 24, respectively, and pumps, 25 and 26, respectively, coupled to the portions by means of openings, 27 and 28 in the sealing unit. (The separation between the portions of differential pressure are not illustrated in FIGS. 1 and 2 since the structure of the seal which permits this separation is illustrated in FIGS. 7 and 8.) The pressures are typically in the range 1–20 Pascals for the portion coupled to opening 27 and 0.5–2 Pascals for the portion coupled to opening 28. Also included in unit 20 is an opening 90 coupled to a hose, 91 and compressed gas tank 92 for introducing argon gas therein which will be utilized in the vacuum processing. Thus, the panel, 10, basically experiences successively decreasing pressure as it moves through the air lock chamber 14 from the atmosphere on one end to the vacuum chamber, 30, at the other end (although the argon pressure at 90 can be slightly greater than the air pressure at 28). The vacuum chamber includes whatever apparatus (not shown) is needed to process the panel. In one example, this is a magnetron sputtering apparatus as described in U.S. patent application of George and Rust filed on an even date herewith. The same type of air lock can be included on the exit side of the vacuum chamber so that the panels experience successively increasing pressure from the vacuum to the atmosphere (i.e., in the view of FIG. 1, the panels would be moving to the left instead of to the right). Thus, the apparatus permits a continuous movement of workpieces into and out of the vacuum chamber.

Figure 3:
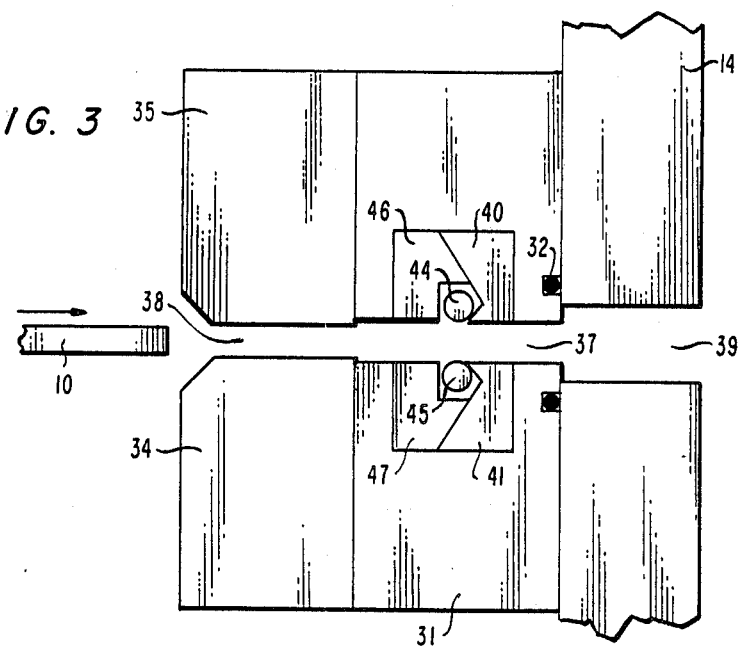
FIG. 3 is a more detailed version of a portion of the apparatus of FIG. 1.

FIG. 3 illustrates in more detail the first sealing unit, 13, with elements corresponding to those of FIGS. 1 and 2 being similarly numbered. The unit includes a backplate 31 which is sealed to the wall of the air lock chamber, 14, by means of O-ring 32. Attached to the backplate are outer plates, 34 and 35, which are structural members to support sealing unit, 13, against atmospheric pressure. All plates can be made of aluminum or other suitable materials and can be attached to the wall of chamber 14, by means of standard bolts (not shown). The plates include gaps, 37 and 38, which allow the panel, 10, to pass through on its way through the opening, 39, in the chamber wall. For use with a printed wiring board panel of 1.57 mm thickness, the openings, 37, 38 and 39, are typically, 1.83 mm, 1.73 mm, and 2.54 mm, respectively.

Figure 4:
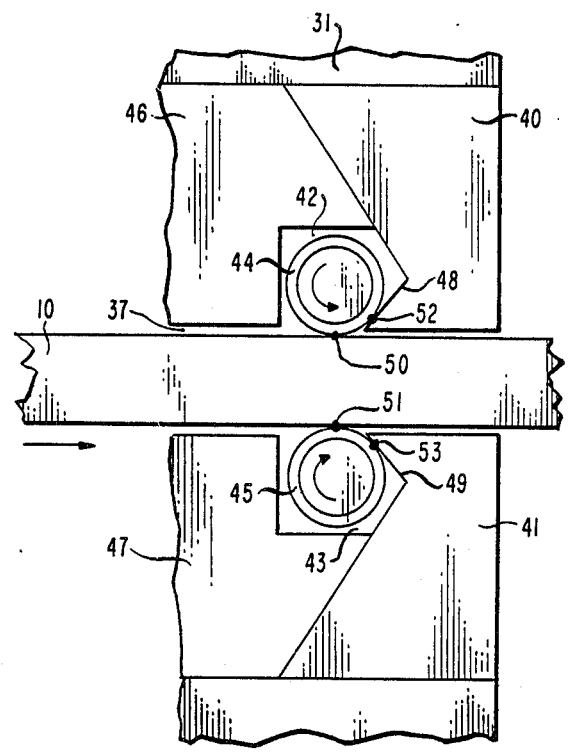
FIG. 4 is a more detailed version of a portion of the apparatus of FIG. 3.

A portion of the backplate, 31, is shown in further detail in FIG. 4 with the panel, 10, passing therethrough. The plate includes housings on both sides of opening 37 where insert members 40 and 41 are provided along with clamping members 46 and 47 adjacent thereto. These insert members 40 and 41 are typically made of a low coefficient of friction material such as Teflon ® while clamping members 46 and 47 are made of stainless steel and are screwed into the backplate 31 to hold the inserts. The inserts and clamping members constitute an enclosure which defines cavities, 42 and 43, each having a size and shape sufficient to rotatably support therein a compliant member, 44 and 45, respectively. In this example, the compliant members are hollow cylindrical tubes with their axes essentially parallel to the major surfaces of the panel. The tubes are made of an elastomer, such as rubber, vinyl or Teflon ®, with a wall thickness sufficient to withstand atmospheric pressure, yet small enough so as not to clamp the panels with excessive force. In this example, the wall thickness was approximately 0.75 mm and the outside diameter of the tubes was 3.13 mm. Other shapes for the compliant members may be used as long as they can withstand atmospheric pressure and are capable of rotational movement as the panels pass through.

As further illustrated in FIG. 4, the size of the cavities, gaps and compliant members is such that when the panel passes through, the compliant members will each contact one of the major surfaces of the panel and will rotate in the direction indicated by the arrows. At the same time, the pressure differential between the atmosphere and the portion 15 of the air lock chamber (FIGS. 1 and 2) will cause the compliant members to be pushed against the back walls, 48 and 49, of their respective cavities and against the surfaces of the panel 10. Thus, as the compliant members rotate, a seal will be provided at the points where the compliant members contact the panel surfaces and the back walls of the cavities as illustrated by the points 50–53. The back walls, 48 and 49 of the cavities are desirably sloped at an angle to the gap 37 in order to prevent deformation of the tubes into the gap. In this example, the pressure difference across the compliant members is approximately $9 \times 10^4$ Pascal, but the unit 13 could be useful where the pressure difference is at least $10^4$ Pascal.

It will be appreciated that cavities 42 and 43 could be formed within the backplate 31 without the inserts and clamps, 40, 41, 46, and 47, as long as the walls of the cavities had a sufficiently low coefficient of friction. It should also be appreciated that a plurality of plates 31 with the compliant members mounted therein in series could be provided to further enhance the seal.

FIGS. 5 and 6 give different views of another portion of the sealing unit, 13. FIG. 5 is an end view showing the panel, 10, as it moves through the tubes, 44 and 45, into the page of the figure, while FIG. 6 shows a side view of the same portion where the panel is moving to the right. It will be noted that the tubes are mounted within cavities in top and bottom plates, 60 and 61, respectively, which are typically made of Teflon ®. (The backplates and inserts of the previous figures have been omitted from these views for the purposes of illustration.) The bottom plate, 61, includes a portion, 64, on which the bottom of the panel slides. A height compensating apparatus consists of a top plate, 60, including thereon a plate 62 in which is mounted a spring loaded element, 63, with a curved front section (See FIG. 6) which receives the top of the panel. The plates 60-62 are inserted within cavities at the top and bottom of plate 31. Thus, the elements 62 and 63 provide a height adjustable guide for the top of the panel to accommodate variations in panel sizes. Alternatively, the height compensating apparatus could be located below the workpiece with the plate, 61, placed above the workpiece. Further, two height compensating apparatuses could be used, one above and one below the workpiece.

FIG. 7 gives a more detailed top view of the sealing unit, 20, illustrated in FIGS. 1 and 2. This unit includes two side plates, 70 and 71 with major surfaces spaced apart to form a gap, 78, to permit the panel, 10, to pass therethrough. The gap is typically 4.78 mm wide. The facing surfaces of the side plates, 70 and 71, each include a plurality of cavities, such as 72 and 73, which run the full height of the plate (approximately 61.0 cm). Each cavity is approximately 4.78 mm wide and spaced from adjacent cavities by a distance of approximately 5.38 mm. Mounted within each cavity, e.g., 72 and 73, is a flexible element, e.g., 74 and 75, respectively, which extends into the gap between the side plates. The flexible elements typically are made of rubber and each extends into the gap so as to make physical contact with an element mounted in a cavity in the opposite major surface of the side plates. (However, it is not necessary that the members 74 and 75 actually make contact.) The elements, therefore, form a series of chevron sealing elements along the gap traversed by the panel. Each flexible element in this example is approximately 61 cm long and 3 mm wide and is mounted in a cavity by means of a bar, e.g., 76 and 77, typically of square cross-section and which is typically made of a metal such as brass or steel and has a dimension typically of 3.18 mm on a side so it is firmly embedded in the cavity. It will be noted that the flexible elements are omitted from the cavities above the openings (27, 28 and 90) where the chamber is pumped out or argon gas is introduced therein as previously described. (See FIG. 2).

The sealing unit is mounted to the wall, 80, separating the air lock chamber and vacuum chamber, and a seal is formed by means of O-ring, 81. It will be noted that the sealing unit, 20, extends partly into the vacuum chamber in this embodiment, but can also be situated entirely within the air lock chamber if desired.

In operation, the pumping through openings 27 and 28 creates a differential pressure across each chevron element composed of the flexible members such as 74 and 75. As the panel moves through the gap between side plates 70 and 71, it will open the chevron elements and said elements will create a seal with the major surfaces of the panel. The members, 74 and 75, are sufficiently thin and compliant so as not to cause excessive friction on the panel. For example, when the members are made of rubber with a thickness of 0.7 mm, a frictional force of 2.22 Newtons is created for each member when approximately 61 cm of the member contacts the workpiece.

This type of seal is preferred for low pressure differentials since the flexible chevron members tend not to withstand atmospheric pressure as well as the unit 13. The seal is probably most useful if the pressure differential from the front end to the back end is less than $2 \times 10^4$ Pascals. The unit, 20, also includes a height compensator plate at the top and a guide plate at the bottom which is similar to that shown for unit 13 in FIGS. 5 and 6.

A further embodiment of the unit, 20, is illustrated in FIG. 8, where elements corresponding to those of FIG. 7 are similarly numbered. Rather than using a plurality of individual flexible members such as 74 and 75, this seal employs a continuous, flexible sheet, 83 and 84, mounted on the major surfaces of the side plates 70 and 71. Again, mounting is effected by metal bars, 76 and 77 within each cavity, and the sheets run essentially the full height of the side plates. The sheets are typically made of rubber. The sheets are mounted so as to be slightly spaced from an opposing sheet in the gap 78 in the areas between the cavities. As the panel, 10, moves through the gap, the sheets will make contact to the panel surfaces and form seals on both major surfaces of the panels. While this design will produce slightly more friction than that of FIG. 7 as the panel moves through, it may be more advantageous in some instances since the panel can move in either direction through the gap. If desired, the sheets could be in contact in the gap.

Various additional modifications of the invention will become apparent to those skilled in the art. All such variations, which basically rely on the teachings through which the invention has advanced the art, are properly considered within the scope of the invention.

What is claimed is:

1. A method of moving a workpiece having two major surfaces between the atmosphere and a vacuum chamber comprising the steps of: passing the workpiece between a pair of compliant members mounted in cavities having walls defined by an enclosure located between the atmosphere and the vacuum such that the members form a rotating seal with at least one of their respective cavity walls and the workpiece as it passes therethrough; creating volumes of differential pressure between the compliant members and the vacuum; and passing the workpiece between a series of flexible members located between one of said volumes of differential pressure and the vacuum chamber, said flexible members forming seals with the major surfaces of the workpiece.

2. The method according to claim 1 wherein the workpiece is a printed circuit board panel.

3. The method according to claim 1 wherein the pressure difference across the series of flexible members is less than $2 \times 10^4$ Pascals.

4. The method according to claim 1 wherein the pressure difference across the compliant members is at least $10^4$ Pascals.

5. Apparatus for processing of workpieces in a vacuum chamber, including means for continuous feeding of the workpieces between the atmosphere and the vacuum chamber comprising: a first sealing unit located between the atmosphere and the vacuum, said unit comprising a pair of compliant members located in cavities having walls defined by enclosures which form a gap to permit passage of the workpieces therethrough, said cavities being coupled to the atmosphere such that the compliant members are pushed against at least one of said walls of their respective cavities and against a major surface of the workpieces to form a rotating seal therewith when the workpieces are fed through an air lock chamber located between the atmosphere and the vacuum chamber, said air lock chamber including volumes within which differential pressures can be created between the atmosphere and vacuum chamber; and a second sealing unit located between one of said volumes and the chamber, said unit comprising a pair of plates which are spaced so as to form a gap which permits passage of the workpiece therethrough and a series of flexible members in the gap which form a seal with the major surfaces of workpieces as it passes therethrough.

6. The apparatus according to claim 5 wherein the compliant members are cylindrical tubes.

7. The apparatus according to claim 5 wherein the said cavity walls are sloped with respect to the gap.

8. The apparatus according to claim 5 further comprising height compensating apparatus mounted to receive an edge of the workpiece in the gap.

9. The apparatus according to claim 5 wherein the flexible members are mounted within cavities formed in the major surfaces of the plates adjacent to the gap.

10. The apparatus according to claim 9 wherein the flexible members are individual elements mounted in each cavity.

11. The apparatus according to claim 9 wherein the flexible members comprise at least two continuous sheets of material, one mounted in the cavities of each major surface.

* * * * *